(12) United States Patent  (10) Patent No.: US 8,878,925 B2
Ban et al.  (45) Date of Patent: Nov. 4, 2014

(54) OBSERVATION METHOD AND OBSERVATION DEVICE

(75) Inventors: Naoma Ban, Hitachinaka (JP); Kenji Obara, Kawasaki (JP)

(73) Assignee: Hitachi High-Technologies Corporation, Tokyo (JP)

( * ) Notice: Subject to any disclaimer, the term of this patent is extended or adjusted under 35 U.S.C. 154(b) by 196 days.

(21) Appl. No.: 13/575,822

(22) PCT Filed: Nov. 8, 2010

(86) PCT No.: PCT/JP2010/006532
§ 371 (c)(1),
(2), (4) Date: Jul. 27, 2012

(87) PCT Pub. No.: WO2011/092771
PCT Pub. Date: Aug. 4, 2011

(65) Prior Publication Data
US 2012/0300056 A1  Nov. 29, 2012

(30) Foreign Application Priority Data

Jan. 28, 2010 (JP) .................................. 2010-016155

(51) Int. Cl.
*H04N 9/47* (2006.01)
*H04N 7/18* (2006.01)
*H04N 5/232* (2006.01)
*G03B 13/00* (2006.01)
*G06K 9/00* (2006.01)

(52) U.S. Cl.
USPC ............................... 348/80; 348/349; 382/147

(58) Field of Classification Search
USPC ........................................................... 348/80
See application file for complete search history.

(56) References Cited

U.S. PATENT DOCUMENTS

| 2003/0113009 | A1* | 6/2003 | Mueller et al. ................. 382/147 |
| 2005/0035290 | A1 | 2/2005 | Saitoh |
| 2005/0194533 | A1 | 9/2005 | Okuda et al. |
| 2007/0187599 | A1 | 8/2007 | Abe et al. |
| 2008/0151097 | A1* | 6/2008 | Chen et al. ..................... 348/349 |
| 2009/0206259 | A1 | 8/2009 | Obara et al. |
| 2009/0212214 | A1 | 8/2009 | Kimba |

FOREIGN PATENT DOCUMENTS

| JP | 10-050245 | 2/1998 |
| JP | 2005-63678 | 3/2005 |
| JP | 2005-285746 | 10/2005 |
| JP | 2006-310223 | 11/2006 |
| JP | 2007-200595 | 8/2007 |
| JP | 2009-194272 | 8/2009 |

OTHER PUBLICATIONS

International Search Report and Written Opinion from International Application No. PCT/JP2010/006532 mailed Jan. 25, 2011.

* cited by examiner

*Primary Examiner* — Hee-Yong Kim
(74) *Attorney, Agent, or Firm* — Brundidge & Stanger, P.C.

(57) ABSTRACT

With respect to a charged particle beam device, the step size of focal point measure for executing autofocusing is optimized to a value that is optimal with respect to the spread of an approximation curve for a focal point measure distribution. The step size of focal point measure for executing autofocusing is corrected using an image feature obtained based on a layout image derived from an image obtained at a first magnification or from design data. Autofocusing is executed based on the obtained step size to carry out observation, measurement, or to image the sample under inspection.

18 Claims, 8 Drawing Sheets

- 200 Low-magnification image
- 201 Defect position
- 202 Image feature acquisition region
- 203 High-magnification defect image imaging region

- 202 Image feature acquisition region
- 200 Low-magnification image
- 201 Defect position
- 203 High-magnification defect image imaging region

OBSERVATION METHOD AND OBSERVATION DEVICE

TECHNICAL FIELD

The present invention relates to a method of observing a sample using a scanning electron microscope for reviewing defects that have occurred in the process of fabricating semiconductor devices, as well as to a device thereof.

BACKGROUND ART

In semiconductor device fabrication processes, in order to observe defects that cause device failures, automatic defect observation is performed wherein an image where a defect detected by an optical inspection device or electron beam-based inspection device is located is re-detected at a high resolution by means of a review SEM device as an application of a scanning electron microscope. Because of the reduction in size of semiconductor device circuit patterns and of the resultant reduction in defect size, such review SEM devices are required to be capable of highly reliable and high-resolution automatic defect observation for defects detected by an inspection device.

With respect to automatic defect observation by review SEM devices, by way of example, the following are known. A review SEM selects one defect from among specified defects, and, at a first magnification setting, images the same site of a chip adjacent to the chip where the defect site is located within the wafer. This site is a site at which the same pattern as that of the defect site is formed, and this image is referred to as a low-magnification reference image. Next, the stage is moved so as to place the defect position at the center of the optical system's view. Then, as when the reference image was obtained, an image is obtained at the first magnification setting. This image is referred to as a low-magnification defect image. Then, based on the defect image and reference image of the first magnification setting, the defect site is identified, and the defect site is imaged at a second magnification setting, which is greater than the first magnification setting for imaging. This image is referred to as a high-magnification defect image. Thus, with review SEM devices, a low-magnification image of a first magnification setting and a high-magnification image of a second magnification setting are obtained in stages.

With review SEM devices whose primary objective is to observe defects in detail based on high-magnification defect images, when obtaining a high-magnification defect image at the second magnification setting, automatic focal position alignment (hereinafter "autofocusing") is performed, where a focusing position with respect to the observed region is automatically calculated. In particular, semiconductor wafers generally have variability in the height direction or are charged, and the focusing position varies depending on the observed region. In order to obtain a high-resolution image with a review SEM device, the focal position of the electron beam must be set to the focusing position each time through autofocusing. The term focusing position as used herein refers to a focal position where the focal point is set with respect to a sample surface, pattern defect, or foreign matter, and at which it is possible to obtain a high-resolution image.

By way of example, an autofocusing process is performed as follows. A plurality of images with varying focal positions are obtained based on predetermined autofocusing conditions. With respect to each of the thus obtained images, a focal point measure, which is an index quantifying the sharpness of the focal point, is calculated. The focal position at which the focal point measure becomes greatest is estimated and set. In general, the sharpness of an edge part captured within an image is often used for the focal point measure, and the value of the focal point measure also increases in accordance with the proximity to the focusing position.

With respect to autofocusing conditions, as a parameter for changing the balance between autofocus precision and the time required for autofocusing, there is the change in focal position in obtaining a plurality of images with varying focal positions (hereinafter "step size").

With respect to step size for autofocusing, by making it finer, more images of varying focal positions are obtained, and errors in the estimated value of the focusing position decrease. However, depending on the defect being imaged, or the material or structure of the pattern, there may be cases where image contrast cannot be obtained, edge sharpness decreases, and a sufficient focal point measure cannot be obtained. In addition, when a large number of images are obtained by varying the focal position by excessively fine step sizes, the time required for autofocusing increases in proportion to the number of images obtained. Accordingly, the operator configures settings taking the balance between autofocus precision and the time required for autofocusing into consideration. Further, in order for the operator to determine the optimal setting for step size, he has to go through a repeated process of trial and error, and the automation of condition setting for the step size to be used for autofocusing is therefore desired.

As a known method of automatically determining autofocusing conditions, there is disclosed in JP Patent Application Publication (Kokai) No. 2009-194272 A (Patent Literature 1) a method in which autofocusing is performed at a plurality of pre-registered coordinate positions with respect to a coordinate system of an observed object, and a search range for autofocusing is automatically determined based on the focal position and focus offset amount at each point.

In addition, as a method of determining autofocusing conditions for high-magnification image acquisition using information obtained from a low-magnification image, there is presented in JP Patent Application Publication (Kokai) No. 2005-285746 A (Patent Literature 2) a method in which a region with an edge strength equal to or greater than a threshold is determined within a region of an obtained low-magnification image, a region containing more than a certain number of pixels of high edge strengths is set as a region for autofocusing, and autofocusing is executed.

In addition, there is presented in JP Patent Application Publication (Kokai) No. 10-050245 A (1998) (Patent Literature 3) an auto focusing method in which a maximum effective scan interval of an electron beam is set, this maximum effective scan interval is compared with the actual scan interval that is based on a magnification that has been set, and, if the actual scan interval is equal to or greater than the maximum effective scan interval, the magnification in the scanning direction of the electron beam is increased to lower the actual scan interval to or below the maximum effective scan interval.

CITATION LIST

Patent Literature

Patent Literature 1: JP Patent Application Publication (Kokai) No. 2009-194272 A
Patent Literature 2: JP Patent Application Publication (Kokai) No. 2005-285746 A Patent Literature 3: JP Patent Application Publication (Kokai) No. 10-050245 A (1998)

SUMMARY OF INVENTION

Technical Problem

In the related art above, the step size for autofocusing is a pre-set fixed value, and does not take into account the sparseness/density of the pattern or the contrast within the autofocus execution region. Consequently, depending on the type of pattern within the autofocus execution region, sufficient autofocus precision may in some cases be unattainable. Reasons for this are discussed below.

In an autofocusing process, focal point measure values, which are obtained from images of varying focal positions, are approximated with a function, e.g., a Gaussian function, etc., and the maximum value of the approximation function is set as the focusing position. In so doing, depending on the sparseness/density of the pattern within the view where autofocusing is to be performed, the spread of the approximation function varies. Consequently, problems may sometimes arise if the step width for autofocusing is fixed. When the spread of the approximation function is markedly narrow or wide, fitting errors occur in estimating the approximation function, as a result of which autofocus precision deteriorates.

To explain in further detail, because the spread of the approximation function becomes narrower as the pattern within the autofocus execution region becomes denser, the number of focal point measure measuring points (points at which an image is obtained to measure a focal point measure. Hereinafter referred to as focal point measure measuring points) contained in proximity to the focusing position of a focal point measure distribution decreases, and the fitting error of the approximation function increases. On the other hand, the spread of the approximation function becomes wider as the pattern within the autofocus execution region becomes sparser. Accordingly, if focal point measure values were to vary even slightly, the fitting error of the approximation function would increase. In addition, in this case, because the number of focal point measure measuring points is excessive in relation to the precision required to estimate the approximation function, it is conceivable that imaging time might increase and throughput decrease.

An object of the present invention is to set a step size for autofocusing in such a manner that an appropriate number of focal point measure measuring points may be obtained with respect to the spread of an approximation curve for a focal point measure distribution obtained from a low-magnification image.

Solution to Problem

In order to achieve the object above, with the present invention, a correction value for the step size is calculated using an image feature obtained from an image taken at a first magnification, or from a portion of a layout image corresponding thereto, and the step size is corrected to be optimal with respect to the spread of an approximation curve for a focal point measure distribution.

The step size for autofocusing is generally determined in a manner dependent on the focal depth, etc., of an optical system. However, with the present invention, a pre-defined step size is corrected to a step size that is optimal with respect to the spread of an approximation function for a focal point measure distribution using a calculated image feature, and set as such. After the step size is corrected, the focal position is shifted in increments of the corrected step size to obtain a plurality of images at a second magnification, and autofocusing is thus executed. Alternatively, instead of correcting a pre-defined step size, the optimal step size may also be determined directly using the image feature. Further, with respect to images for determining the image feature, they may be image data obtained by actually imaging the sample under observation, or composite images composed from design data or layout data of the sample under observation, either of which is fine.

Advantageous Effects of Invention

With the present invention, it is possible to mitigate the influence that the type of pattern of the region for which autofocusing is to be performed has on autofocusing.

DESCRIPTION OF EMBODIMENTS

Example 1

Figure 1:
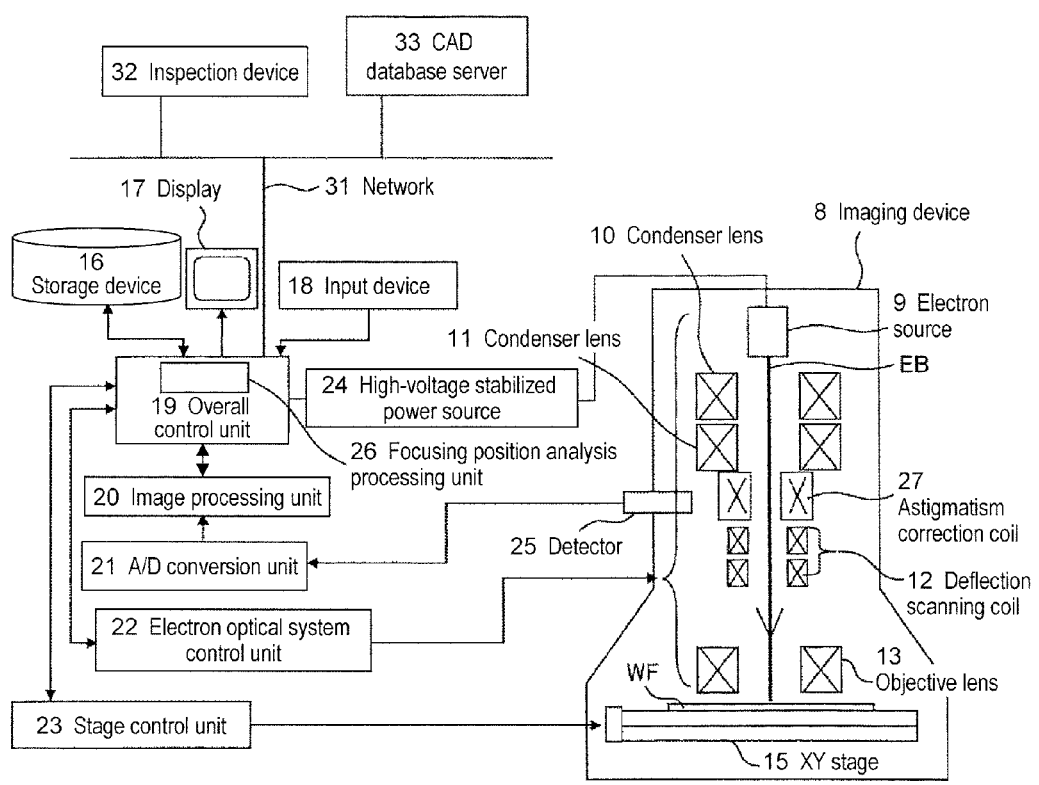
FIG. 1 shows a general configuration of an electron microscope as an embodiment of the present invention.

An embodiment of the present example is described below with reference to the drawings. FIG. 1 is a vertical sectional view showing a general configuration of an electron microscope. With respect to an imaging device 8 of a review SEM device, which is obtained by improving a scanning electron microscope so that it may be used for observing defects in circuit patterns formed on semiconductor wafers, the part between a semiconductor wafer WF and where an electron beam EB is generated is maintained under a vacuum. The imaging device 8 is provided with an electron source 9, condenser lenses 10 and 11, deflection scanning coils 12, an objective lens 13, an astigmatism correction coil 27, an XY stage 15, and a detector 25. In addition, outside of the vacuum device, there are provided a storage device 16, a display 17, an input device 18, an image processing unit 20, an A/D conversion unit 21, an electron optical system control unit 22, a stage control unit 23, and a high-voltage stabilized power source 24. An overall control unit 19 is provided with a focusing position analysis processing unit 26.

If necessary, an inspection device 32 and a CAD database server 33 are connected to the electron microscope via a network 31.

The semiconductor wafer WF to be inspected is mounted on the XY stage 15. A control signal from the overall control unit 19 is sent to the stage control unit 23, which is then sent from the stage control unit 23 to the XY stage 15, and the XY stage 15 is thus controlled to move in the X and Y directions. The electron beam EB emitted from the electron source 9 is focused by the condenser lenses 10, 11 and the objective lens 13, is made to scan across the semiconductor wafer WF by the deflection scanning coils 12, and is thus made to irradiate the semiconductor WF under inspection. Secondary electrons and backscattered electrons obtained from the semiconductor wafer WF as a result of this irradiation are detected at the detector 25 and undergo a conversion process of from an analog signal to a digital signal at the A/D conversion unit 21. Digital image data of the semiconductor wafer WF is thus generated and displayed on the display 17. Such image processing as a defect detection process, etc., is performed at the image processing unit 20. At the input device 18, the operator enters input items for defect observation conditions and autofocusing conditions.

Defect coordinate data of the semiconductor wafer WF is sent from the inspection device 32 to the overall control unit 19 via the network 31. At the overall control unit 19, based on the received defect coordinate data, a stage move command is sent to the stage control unit 23 so as to place the defect within the view of the imaging device 8, and the XY stage 15 is moved.

In autofocusing the electron beam EB, the magnification and the focal position may be set independently in accordance with the optical conditions of the objective lens 13, the condenser lens 10, etc. In the present example, it is controlled through the excitation intensity of the objective lens 13. The objective lens 13 comes in a wide variety of forms, e.g., in-lens type, out-lens type, snorkel type (semi-in-lens type), etc. In addition, it may also be of a retarding type where a negative voltage is applied to the semiconductor wafer WF to slow down the primary electron beam.

The focal depth of an electron microscope generally becomes shallower as its magnification increases. In addition, there are also height fluctuations depending on the observation position due to, for example, warps in the geometry of the semiconductor wafer WF. Accordingly, in order to obtain an SEM image of a defect, this autofocusing is performed prior to obtaining an SEM image. In an embodiment of the present example, the overall control unit 19 comprises a means for executing autofocusing. An image feature analysis of a region for which autofocusing is to be performed is executed at the focusing position analysis processing unit 26 provided in the overall control unit 19. The focusing position analysis processing unit 26 also includes a step size determination unit that determines a step size based on the obtained image feature. It is noted that the result of autofocusing may be displayed on the display 17 or stored as log information. In particular, with respect to information used for autofocusing, e.g., a later-discussed image feature acquisition region, etc., by leaving a log thereof in such a manner that it may be collated with the corresponding lot which moves down a semiconductor fabrication line or with the inspection date and time, it may be put to good use in finding out the cause of error in the event of a drop in defect detection rate. In other words, if the defect detection rate drops, since it is possible to determine, after imaging, whether or not there was a problem in the selection of an autofocus execution region, or in the upper limit and lower limit settings for the correction value, etc., it is possible to retroactively analyze whether or not a high-magnification image had been obtained accurately.

Figure 2:
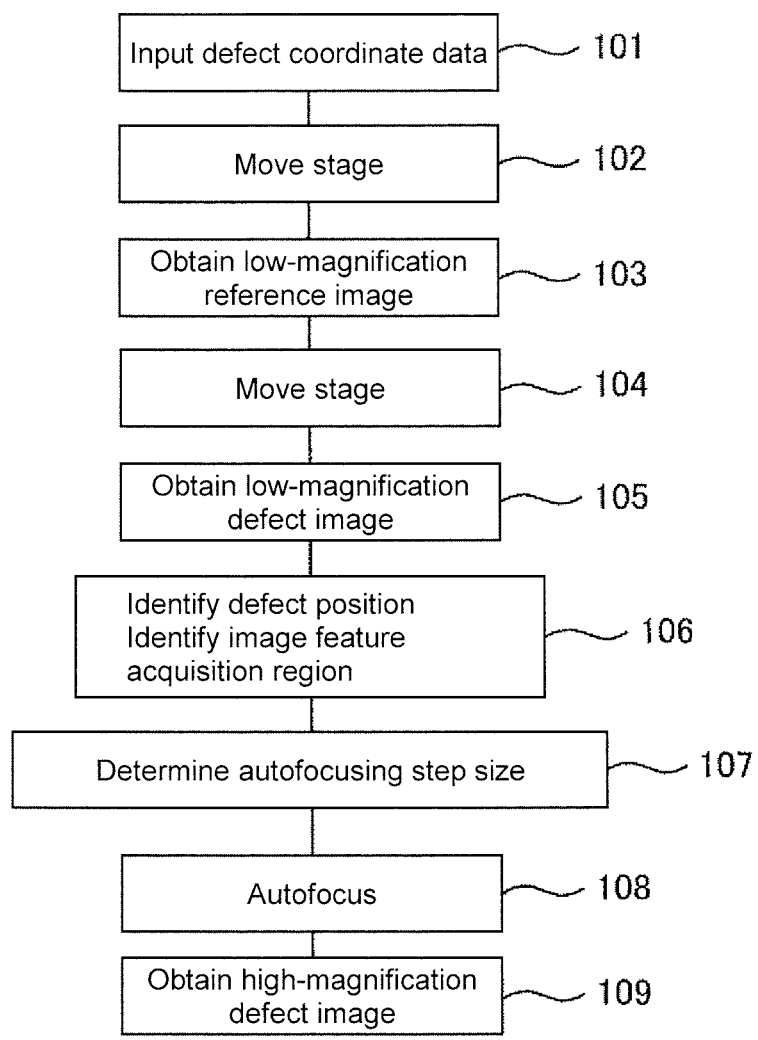
FIG. 2 is a flowchart showing an image acquisition procedure with respect to the present invention.

Next, there is shown in FIG. 2 a flowchart indicating a procedure for image acquisition during automatic defect observation with respect to the present example as practised with, for example, the above-discussed device.

Defect coordinate data, which is coordinate position information for each defect detected by the optical or electron beam-based inspection device 32, is inputted to the review SEM via the network 31 (step 101).

Next, by moving the XY stage based on defect data, the view of the imaging device 8 is moved to the same position on a chip adjacent to the chip that has the defect (step 102), and a low-magnification reference image is obtained (step 103). Similarly, by moving the XY stage, the view of the imaging device 8 is moved to the chip that has the defect (step 104), and a low-magnification defect image is obtained (step 105). Although autofocusing may be executed when performing step 103 and step 104, since the focal depth of a SEM generally becomes greater as the magnification decreases, if a sufficient focal depth is already obtained with the magnification employed, autofocusing need not always be performed. In addition, if the sample is such that there are significant fluctuations in height within the wafer, or the influence of charges is significant, a focus map in which stage coordinates and focusing are mapped to each other may be created in advance prior to performing step 102, and the focus value for given stage coordinates may be determined based on that focus map, thereby obviating the need for autofocusing during low-magnification image acquisition (hereinafter "low-magnification autofocusing").

Figure 3A:
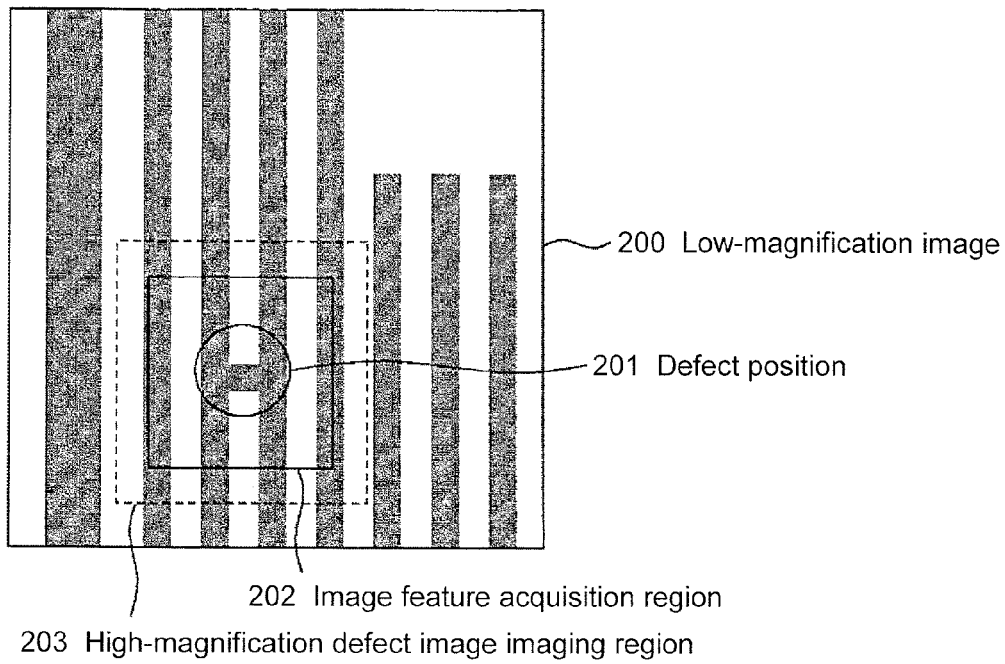
FIG. 3(A) is a diagram showing a defect position and an image feature acquisition region with respect to a low-magnification image.

Next, as shown in FIG. 3(A), from within a low-magnification image 200, the focusing position analysis processing unit 26 identifies a partial image of a defect position 201 and an image feature acquisition region 202 (step 106). In the present example, the image feature acquisition region 202 is selected from a portion of the low-magnification image. The size of the image feature acquisition region 202 is often approximately the same as the imaging region of the high-magnification defect image. However, it may also be a region corresponding to a pre-defined magnification at which autofocusing is to be performed, or, for the purpose of shortening the time required for autofocusing, a smaller region than the imaging region for the high-magnification defect image.

Figure 3B:
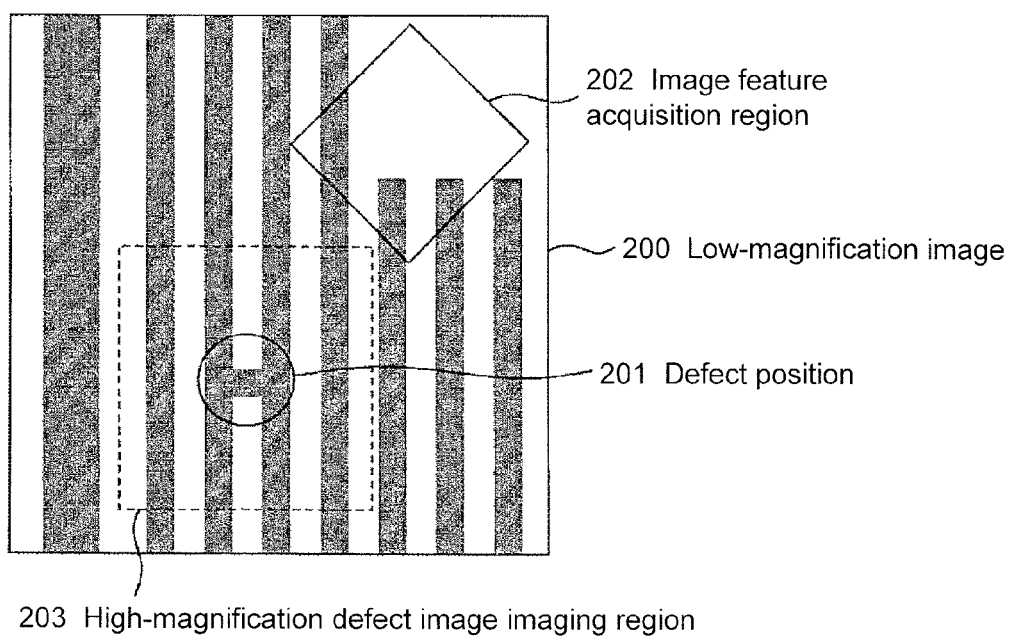
FIG. 3(B) is a diagram showing a defect position and an image feature acquisition region with respect to a low-magnification image.

In addition, the image feature acquisition region 202 is ordinarily so selected as to contain the defect position 201 as shown in FIG. 3(A). However, so long as at least a portion of the pattern, foreign matter, or defect is contained, it may also be a position away from the defect position 201 or an imaging region 203 for the high-magnification defect image as shown in FIG. 3(B). By way of example, in cases where the defect size is markedly large, if the image feature acquisition region 202 were to be so selected as to contain the defect position, it would become impossible to obtain appropriate sparseness/density information. Accordingly, in such cases, it is better to select the image feature acquisition region 202 in such a manner as to exclude the defect position therefrom. Also, the image feature acquisition region 202 may be rotated relative to the direction in which the electron beam is scanned during low-magnification image acquisition. In this case, a rotation process for the image feature acquisition region 202 cut out from the low-magnification image 200 is executed by the focusing position analysis processing unit 26.

Further, depending on the image feature acquisition region 202 selected, the image size may vary, and image features obtained from the image feature acquisition region, e.g., pattern sparseness/density, etc., may also vary. In such cases, by normalizing the image feature, e.g., pattern sparseness/density, etc., relative to the image size of the image feature acquisition region, the step size may be corrected by a uniform standard even if a different region were to be selected for each instance of autofocusing. In addition, the image feature acquisition region 202 may also be manually specified by the operator, or automatically selected. Automatic selection would alleviate the burden on the operator.

Next, in step 107, from within the low-magnification image, the sparseness/density of the pattern within the autofocusing region is calculated at the focusing position analysis processing unit 26, and, based on the result thereof, the optimal step size for high-magnification autofocusing is determined.

The method in step 107 of determining a step size for high-magnification autofocusing using a low-magnification image is described in detail below. It is noted that although, in the present example, a low-magnification defect image is used as the low-magnification image, a low-magnification reference image may also be used. What is important in the determination method is the fact that a step size for high-magnification autofocusing is determined using a value quantifying an image feature, e.g., the sparseness/density of a pattern within the image feature acquisition region selected from the low-magnification image, the edge amount of a pattern contained in the image, etc.

Figure 4:
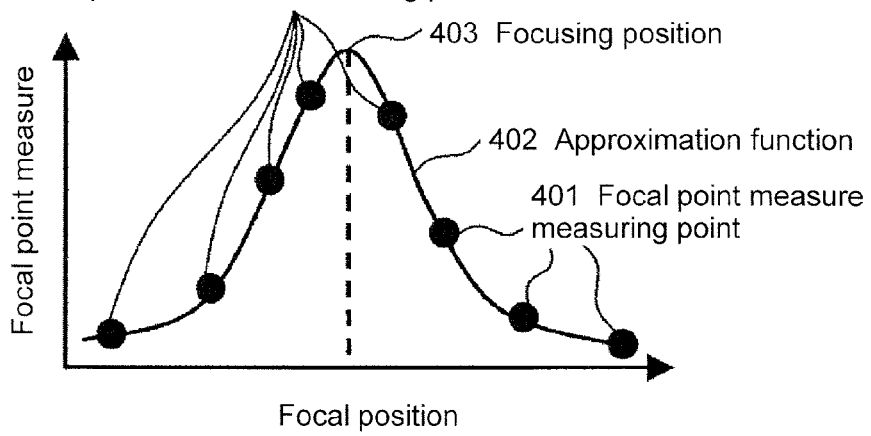
FIG. 4 shows the relationship between autofocusing step size and focal point measure distribution.

The relationship between autofocusing step size and focal point measure distribution, which is necessary for estimating the focusing position, will now be discussed using FIG. 4. In generally known autofocusing processes, a focal point measure distribution of focal point measure measuring points 401 obtained from images of varying focal positions is approximated with a function, e.g., a Gaussian function, a quadratic function, etc., and a peak position, e.g., the maximum value, of that approximation function 402 is taken to be a focusing position 403.

Figure 5A:
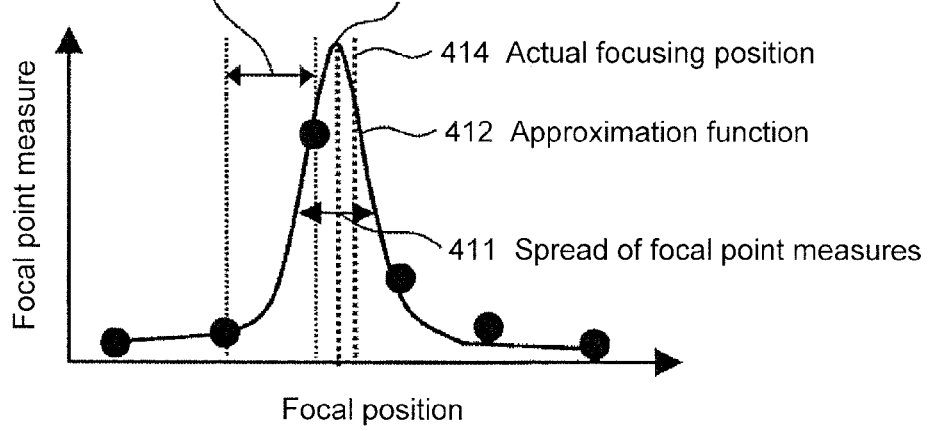
FIG. 5(A) shows an example where the spread of a focal point measure distribution and the step interval are inappropriate.
Figure 5B:
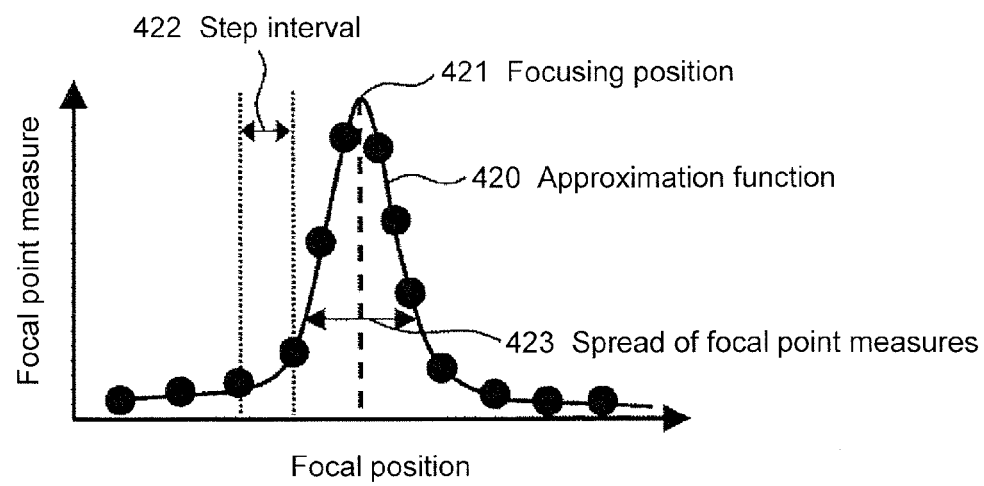
FIG. 5(B) shows an example where the spread of a focal point measure distribution and the step interval are appropriate.

However, in the focal point measure distribution shown in FIG. 5(A), a step interval 410 between focal point measures is relatively wide with respect to a spread 411 of the focal point measures. Thus, a fitting error of an approximation function 412 occurs, generating a focal position discrepancy between a focusing position 413 estimated from the approximation function and an actual focusing position 414. As such, as shown in FIG. 5(B), in order to favorably approximate a focal point measure distribution with a function, reduce the fitting error of an approximation function 420, and estimate a focusing position 421 with favorable precision, it is necessary to make a step interval 422 between focal point measures sufficiently dense relative to a spread 423 of the focal point measures of the approximation function 420. In other words, it is necessary to determine the step size in such a manner that a sufficient number of focal point measure measuring points would be included at the peak portion of the approximation function 420. By thus setting the step size, it is possible to reduce the fitting error of the approximation function and improve autofocus precision.

On the other hand, if the step interval between focal point measures is sufficient relative to the spread of the focal point measures, there is no need to make it denser than necessary. When it is made denser than necessary, the number of images obtained during autofocusing increases, thereby causing the time required for autofocusing to increase. Further, in the case of a device that uses a charged particle beam, it is conceivable that by performing imaging a plurality of times, the sample may be damaged by the electron beam with which it is irradiated. Accordingly, in order to obtain a sufficient number of measuring points of focal point measures for estimating an approximation curve with favorable precision, it is important that an appropriate autofocusing step size be determined. In this case, by correcting the step size to one that is appropriate, it becomes possible to shorten the time required for autofocusing, and to perform focal point alignment at the required precision in a short period of time.

By way of example, in the case of approximation with a Gaussian function, the spread of the approximation function may be defined in terms of the full width at half maximum of the statistics, the standard deviation, etc., as indices representing the extent of spread of a mound-shaped function.

Here, the spread of an approximation function for a focal point measure distribution varies with the image feature within the autofocus execution region (or the image feature acquisition region if the autofocus execution region is so set as to be the image feature acquisition region). This will be described using FIG. 6.

Figure 6:
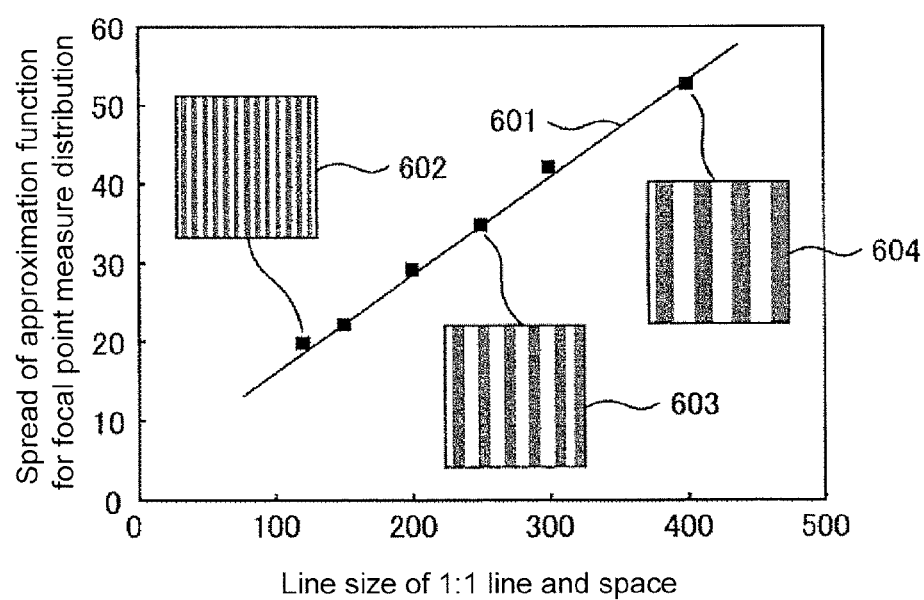
FIG. 6 is a relational diagram for focal point measure distribution spread and pattern line width size.

In the description below, pattern sparseness/density is provided as an example of an image feature. With respect to a given magnification and step size, FIG. 6 shows the relationship between spreads of approximation functions for focal point measure distributions, which are obtained by performing autofocusing with respect to 1:1 line and space patterns whose line width sizes within images vary, and the line width sizes of the 1:1 line and space patterns.

It can be seen therein that, even when the magnification is constant, as pattern sparseness/density, i.e., the line width of the 1:1 line and space pattern, increases from image 602 to image 603 to image 604, the spread of the approximation function increases. It is known that the focal depth of an electron optical system is generally determined by optical conditions, and that it does not vary if the magnification is constant. However, based on the relationship in FIG. 6, it may be said that as the sparseness/density of the pattern varies, the focal depth appears to vary. In addition, the relationship between the sparseness/density of a pattern and the spread of an approximation function can be approximated favorably with a linear equation (601).

In the present example and in view of the point above, based on the sparseness/density of a pattern within the image feature acquisition region, the spread of an approximation function for a focal point measure distribution is estimated, and a correction value for correcting to the optical step size is determined. To this end, a step size determination unit is provided within the overall control unit 19, and the above-mentioned correction value, or an appropriate step size, is determined based on the image feature calculated at the focusing position analysis processing unit 26.

Four representative methods of quantifying sparseness/density will now be discussed. It is noted that, with respect to the four methods below, the correction value for the step size may be determined by estimating the spread of the approximation function using a characteristic amount of an image in the image feature acquisition region, or, assuming the relationship between the characteristic amount of an image in the image feature acquisition region and the spread of the approximation function is monotonous, the characteristic amount of the image may be normalized in some appropriate manner and directly taken to be the correction value for the step size.

Method (1)

The sparseness/density of an image is quantified by calculating the mean value of a histogram of the brightness values of the image, that is, the mean brightness of the image. When the pattern in the image is dense, there are many edges, and it tends to be bright. On the other hand, when the pattern in the image is sparse, there are few edges, and it tends to be dark. Accordingly, with respect to an image, assuming the mean value is $\mu_b$ based on a histogram of brightness values, correction value $RF_b$ for the step size may be expressed by equation [1].

$$RF_b = k_1 \times \mu_b + k_2 \quad \text{Equation [1]}$$

With respect to the equation above, $k_1$ and $k_2$ are constants determined in advance by evaluating patterns of varying sparseness/density. $k_1$ and $k_2$ are determined based on the following two conditions. First, a pattern, the spread of whose approximation curve is known in advance, is taken to be a reference. Assuming correction value $RF_b$ corresponding to this pattern is 1, then $RF_b$ is so determined as to take on a value smaller than 1 in the case of a pattern denser than the predefined reference pattern, or to be greater than 1 in the case of a sparser pattern. Further, one of $k_1$ and $k_2$ is set as the threshold for correction value $RF_b$. In other words, a threshold condition is imposed in such a manner that correction value $RF_b$ would fall within an appropriate range even for the most dense or most sparse part of the pattern contained in the subject under inspection. It is noted that, for the threshold for correction value $RF_b$, a fixed value may be set in advance, or an operator may be allowed to specify it.

Method (2)

It is also possible to quantify the sparseness/density of an image by calculating the variance of a histogram of brightness values of the image, that is, by calculating the contrast. When the pattern within the image is dense, many edges are contained, and the contrast tends to be high. On the other hand, when the pattern within the image is sparse, there are few edges, and the contrast tends to be low. Assuming the variance of the histogram of brightness values is $\sigma$, correction value $RF_c$ determined based on the sparseness/density of the image may be expressed by Equation [2]. With respect to Equation [2], $k_3$ and $k_4$ are constants, and their values are determined in a fashion similar to $k_1$ and $k_2$.

$$RF_c = k_3 \times \sigma + k_4 \quad \text{Equation [2]}$$

Method (3)

By applying to the SEM image a spatial filter called an edge detection filter, the mean value of the image as a whole is calculated, and sparseness/density is evaluated. Known edge detection filters include the Sobel filter and the gradient filter, which are first order derivative filters, and the Laplacian filter, which is a second order derivative filter, among others. When many edges are contained in the image, the mean value for the image after an edge detection filtering process becomes large, whereas when there are few edges, the mean value becomes small. Accordingly, assuming the mean value is $\mu_e$, correction value $RF_e$ for the step size may be expressed by Equation [3]. With respect to Equation [3], $RF_e$ reflects the sparseness/density of the SEM image. In addition, with respect to Equation [3], $k_5$ and $k_6$ are constants, and their values are determined in a fashion similar to $k_1$ and $k_2$.

$$RF_e = k_5 \times \mu_e + k_6 \quad \text{Equation [3]}$$

Method (4)

The spatial frequency of an image is evaluated. If the spatial frequency is high, the pattern within the image tends to be dense with abrupt changes, e.g., edges, etc., occurring. On the other hand, if the spatial frequency component is low, the pattern tends to be sparse. Accordingly, assuming the most frequently occurring spatial frequency component in the image is f, correction value $RF_f$ for the step size may be expressed by Equation [4]. The correction value in Equation [4] reflects the sparseness/density of the pattern in the image. In addition, with respect to Equation [4], $k_7$ and $k_8$ are constants, and their values are determined in a fashion similar to $k_1$ and $k_2$.

$$RF_f = k_7 \times f + k_8 \quad \text{Equation [4]}$$

In the focusing position analysis processing unit 26 of the present example, a means for executing at least one or a plurality of the four methods described above is implemented in the form of hardware or software. In the case of hardware implementation, a chip that carries out the various equations is provided. In the case of software implementation, a program for carrying out the various equations mentioned above is executed by a processor that the overall control unit 19 or the focusing position analysis processing unit 26 has.

Next, a method of determining the optimal step size is discussed.

The autofocusing step size of a typical electron microscope is determined dependently on the magnification and accelerating voltage of the electron optical system as indicated by Equation [5] below.

$$S = k_9 \times A \times M^K / B \quad \text{Equation [5]}$$

where S is the step size, M is the magnification, and B is the sensitivity coefficient of the objective lens with respect to the electron beam, which is dependent on the accelerating voltage. A and K are constants that each vary depending on the electron optical conditions. In addition, some electron microscopes allow the operator to select a plurality of $k_9$'s as parameters for varying the balance between the step size, or the autofocus precision corresponding to step size, and the time required for autofocusing.

Figure 7:
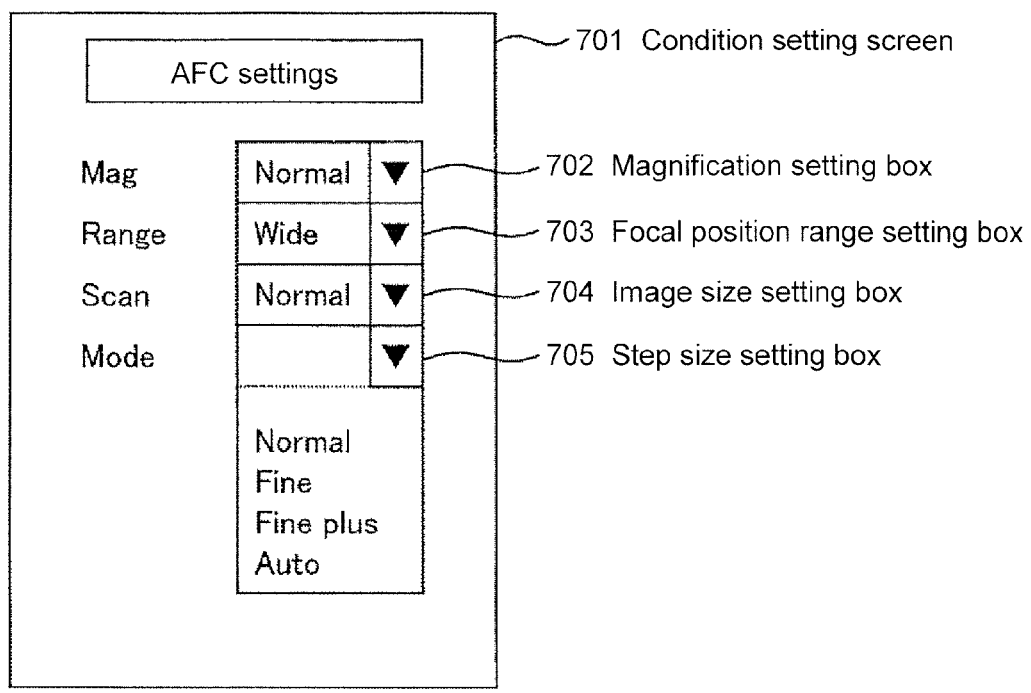
FIG. 7 is a diagram of a GUI screen for setting autofocusing conditions.

Autofocusing conditions are set, by way of example, through a GUI screen such as that shown in FIG. 7. By way of example, a condition setting screen 701 for autofocusing displays: a magnification setting box 702 for setting the magnification for autofocusing; a focal position range setting box 703 for setting the range over which the focal position may be moved for imaging; an image size setting box 704 for setting the size of the image region to be used for autofocusing; a step size setting box 705 for setting the step size, which is the increment for shifting the focal position; and so forth. With respect to the step size setting box 705, for operability purposes, this parameter generally has few types, namely all three of the following, or any two selected therefrom: priority on precision (Fine plus), emphasis on balance between precision and speed (Fine), and priority on speed (Normal), which respectively correspond to cases where $k_9$ is of a value less than 1, equal to 1, and greater than 1.

In the present example, the device is so configured as to allow selection of Auto, which signifies automatic setting, in addition to the types above. When Auto is selected, $k_9$ in Equation [5] is set to 1, and optimal step size S' is set based on an equation for calculating step size S' as shown in Equation [6] for the subsequent stage.

$$S' = RF_b \times S \quad \text{Equation [6]}$$

Here, in Equation [6] above, as a correction value for step size S, correction value $RF_b$ of Equation [1] determined based on sparseness/density is used. However, it goes without saying that any of Equations [2] to [4] may also be used. In addition, in Equation [6] mentioned above, although a step size determined through Equation [5] is corrected through Equation [6], it is obvious that S' may also be calculated directly using given values of A, M, K, B and RF.

It is noted that, in the present example, there need not necessarily be a parameter for varying the balance between the conventional step size, or the autofocus precision corresponding to step size, and the time required for autofocusing. In addition, in such a case, since Auto would be selected as a default setting, there is no need to provide the electron microscope with a means for the operator to vary this parameter, and the step size setting box 705 therefore need not be displayed on the condition setting screen 701 for autofocusing.

When determining the step size correction value, calculations do not have to be based solely on one of Equation [1] to Equation [4]. Instead, by way of example, a plurality of equations may be combined as in Equation [7]. By combining a plurality of equations, the precision of the correction value further improves. $k_{10}$ is a correction coefficient for when a plurality of equations are combined, and would be ¼ if the four equations are combined evenly.

$$S'=S\times(RF_b+RF_c+RF_e+RF_f)\times k_{10} \qquad \text{Equation [7]}$$

In addition, as in Equation [8], the correction values determined based on sparseness/density as calculated by the respective methods above may be weighted to vary their contributions to the correction value.

$$S'=S\times(k_{11}\times RF_b+k_{12}\times RF_c+k_{13}\times RF_e+k_{14}\times RF_f)\times k_{10} \qquad \text{Equation [8]}$$

By way of example, for a blanket film wafer or a bare wafer, because there would be no semiconductor circuit pattern within the image, if the defect or foreign matter is extremely small, noise would often be the main component of factors causing fluctuations in sparseness/density, in which case it may sometimes be difficult to calculate an appropriate correction value for the step size with method (1) or method (2). On the other hand, with respect to method (3) and method (4), the correction value may be calculated with ease. Accordingly, by so setting $k_{13}$ and $k_{14}$ in Equation [8] as to be greater in value than $k_{11}$ and $k_{12}$, it may be possible to obtain an effect where the precision of the correction value is improved.

Such weighting coefficients may be set by the operator at the input device 12, or a set of weighting coefficients per observation subject may be pre-stored on a memory, register, etc., within the overall control unit 19 as fixed values and referenced by the step size determination unit. As the operator selects a mode as required, based on the selected mode information, the step size determination unit sets an appropriate set of weighting coefficients, and corrects the step size based on the combination that has been set. By thus combining image features obtained through a plurality of methods, an appropriate correction value may be obtained even when the observation subject is changed, thereby reducing influences on the duration and precision of autofocusing caused by the observation subject.

In the flow in FIG. 2, a process of judging whether or not S' is appropriate may also be executed. A judgment as to whether or not S' satisfies a pre-defined standard is made by a step size judging means provided within the overall control unit 19, and the step of judging S' is provided after step 106 for determining the autofocusing step size in FIG. 2. By way of example, by checking, between step 106 and step 107, the validity of corrected step size S', autofocusing failures may be prevented before autofocusing is executed. In addition, by judging the step size after executing step 108, the validity of the observation result may be examined after autofocusing has been executed.

Next, a specific method of judging the validity of S' is described. In order to improve the precision of the focusing position, it is important that a sufficient number of focal point measure measuring points be contained in the peak part of the approximation curve for the focal point measure distribution. Correction value $RF_b$ and the spread of the corresponding focal point measure distribution are obtained in advance, and, based on the relationship therebetween, the spread of the focal point measure distribution corresponding to correction value $RF_b$ of the judgment subject is estimated, and it is judged whether or not N or more focal positions would be contained within the spread of this focal point measure distribution when imaging is carried out by shifting the focal position in increments of corrected step size S'. The judging method may be expressed by Equation [9] where FW is the spread of the focal point measure distribution. When N or more are contained, it is judged to be appropriate and the process proceeds to the next step. When there are N or less, it is judged to be inappropriate, the process returns to step 106, the image feature acquisition region is altered, and step 107 is executed again. Alternatively, it may be so arranged that correction value RF determined based on sparseness/density is changed to a smaller value, and the process proceeds to step 108 that follows. As an example of threshold N for judgment, N=5 is often employed, for example. According to the applicant's experience, assuming the spread of the focal point measure distribution is full width at half maximum, the focal point measure distribution can often be approximated favorably with a function as long as N is of a value equal to or greater than 5. It is thus possible to achieve favorable autofocus precision.

$$FW/S'\geq N \qquad \text{Equation [9]}$$

In addition, for the step size judging means, an upper limit value and a lower limit value may be provided with respect to the correction values determined by Equation [1] to Equation [4]. By providing an upper limit value, it becomes possible to prevent S' from becoming small and the time required for autofocusing from increasing in the event that the correction value becomes an extremely small value. On the other hand, by providing a lower limit value, it is possible to prevent fitting errors from occurring in the function approximation for the focal point measure distribution as a result of there not being enough focal point measure measuring points for autofocusing and autofocus precision from deteriorating in the event that the correction value becomes an extremely large value. Similar effects may also be obtained by providing an upper limit value and a lower limit value for the step size. It is noted that the values of threshold N, the upper limit, and the lower limit described above are stored on a memory or register within the overall control unit 19, and are referenced by the step size judging means when needed.

By providing such a judging means, it is ensured that an optimal step size is set. It is noted that by displaying the judgment result on a display, etc., the operator would be able to check the appropriateness of the corrected step size. If, through the judgment, it is identified that the corrected step size is inappropriate, a warning message may be displayed on the screen to prompt the operator to check and readjust.

Next, autofocusing is performed with step size S' determined through Equation [6] (step 108). Here, by means of the electron optical system control unit 22, the excitation intensity of the objective lens 13, which corresponds to the step interval of S', is varied, and a plurality of images with varying focal positions are obtained and stored on the focusing position analysis processing unit 26. Next, with respect to the stored images, focal point measures, which are indices quantifying the sharpness of a focal point, are calculated at the focusing position analysis processing unit 26, and, through function approximation of the focal point measure distribution, the focal position at which the focal point measure becomes greatest is estimated, and the excitation intensity of the objective lens 13 is set to the focusing position by the electron optical system control unit 22.

Next, a high-magnification defect image is obtained (step 109). After step 109 is completed, it is determined whether or not there is a coordinate position to be imaged next. If there is one, the view is shifted to the next defect position, whereas if there are none, imaging is terminated. A flow indicating an image acquisition procedure for automatic defect observation using a method of determining a high-magnification autofocusing step size using a low-magnification image has been described above.

With a charged particle beam device or an observation method of the present example, such influences as an increase in the time required for autofocusing, a drop in autofocus precision, etc., due to the type of pattern formed in the autofocus execution region may be reduced, and, ultimately, drops in observation speed (throughput) due to re-acquisition of images are suppressed. Further, because it becomes unnecessary for the operator to perform a process of adjusting the step width, the burden on the operator to set the autofocusing conditions of the electron beam is reduced, and stable sample observations become possible regardless of the experience or skill of the operator.

Example 2

In the present embodiment, a description will be provided with respect to a charged particle device, particularly a defect review device, including a function of determining a step size for autofocusing that employs CAD data that is layout information for a pattern on a semiconductor wafer. Since the hardware configuration of the device is generally the same as that in FIG. 1, descriptions for like parts will be omitted, referring to elements in FIG. 1 where necessary.

Figure 8:
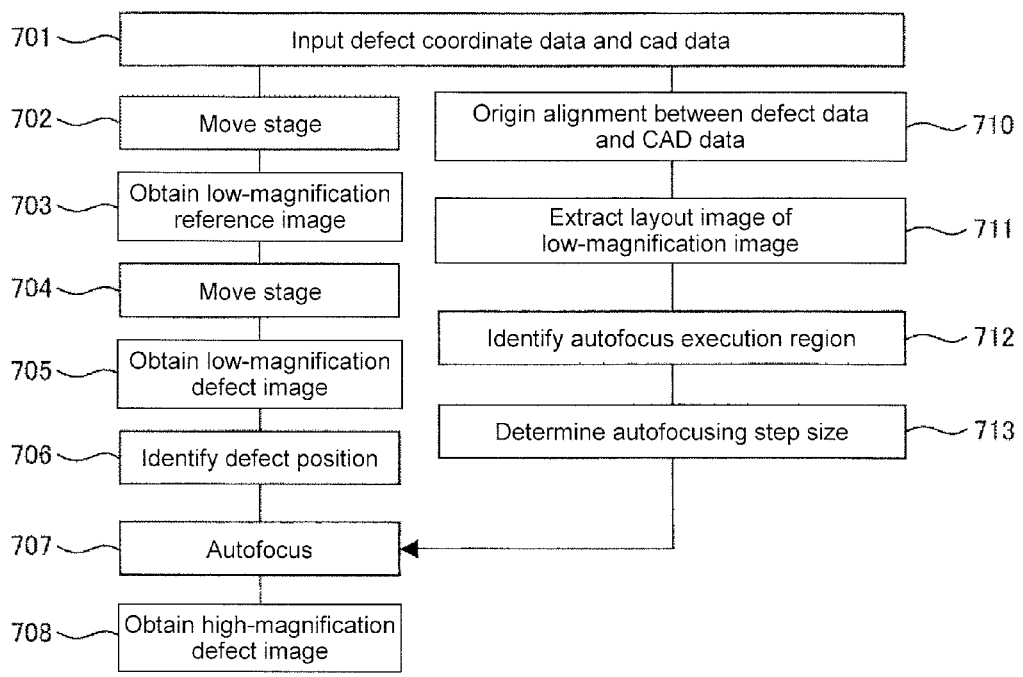
FIG. 8 is a flowchart for a case where autofocusing is executed based on CAD data.

First, using the flowchart in FIG. 8, a device operation is described where a high-magnification image of a defect present on a sample under observation is obtained. As the operator of the device instructs the reading of defect coordinate data and CAD data through the input device 18, defect coordinate data and CAD data are respectively inputted to the review SEM from the inspection device 32 and the CAD database server 33 via the network 31 (step 701). The term defect coordinate data as used above refers to a data file containing the ID and coordinate information of each defect position detected by the optical or electron beam-based inspection device 32, and the term CAD data refers to layout information of the pattern formed on the wafer under review. The inputted CAD data is stored on the storage device 16 via the overall control unit 19. Before being inputted to the review SEM, the defect coordinate data or CAD data is converted, if necessary, to a data format that is processable by the review SEM. By way of example, this may include a synthesizing process where pixel data of a wiring pattern (a pattern layout image) is synthesized from layout information.

Next, at the focusing position analysis processing unit 26, origin alignment is executed between the defect position coordinates defined in the defect data and the design layout of the CAD data (step 710). In the origin alignment of step 710, the origin and axes of the coordinate system of the data representing position with respect to the CAD data are aligned with the origin and axes of the coordinate system of the data representing position with respect to the defect data, as a result of which it is possible to express the same position information with the same data between both data.

The processes of steps 702 through 706 are also executed in parallel within the device. However, since the contents of the processes are similar to those in Example 1, their descriptions are omitted.

Next, from the CAD data, a pattern layout image of a region corresponding to the view size of the low-magnification image is extracted (step 711). This process is executed by the focusing position analysis processing unit 26. Alternatively, a dedicated processing unit for cutting out CAD data may be provided as well. Since origin alignment is performed in step 710, based on the defect coordinate position, it is possible to obtain with ease a layout image of the CAD data corresponding to the low-magnification image. It is noted that, in cases where the autofocus execution region is rotated relative to the scanning direction of the electron beam for obtaining a low-magnification image, the pattern layout image corresponding to the low-magnification image is also extracted by being rotated. In addition, at the review SEM, in order to reduce errors between the defect position coordinates provided in the defect data and the actual defect position coordinates, alignment (wafer alignment) for calibrating the stage coordinate positions of the review SEM and the inspection device is performed using the device pattern formed on the wafer. If that alone does not result in sufficient coordinate calibration, using a defect, high-precision alignment (fine alignment) is performed based on the defect coordinate position outputted by the inspection device and the defect coordinate position measured by the review SEM. Naturally, in the pattern layout image extraction of step 711, calibration results of the above-mentioned wafer alignment and fine alignment are taken into account.

Next, in step 712, from the pattern layout image corresponding to the low-magnification image, an autofocus execution region is identified. This process is also executed by the focusing position analysis processing unit 26. It is preferable that a pattern for which an appropriate focal point measure value is calculable be included in the autofocus execution region. A method of identifying an appropriate autofocus execution region is described below. It is noted that a description is provided below with respect to an example where a correction value determined based on, as an image feature, sparseness/density is used. However, other image features, e.g., pattern edge amount, etc., may also be used as mentioned in Example 1.

Figure 9:
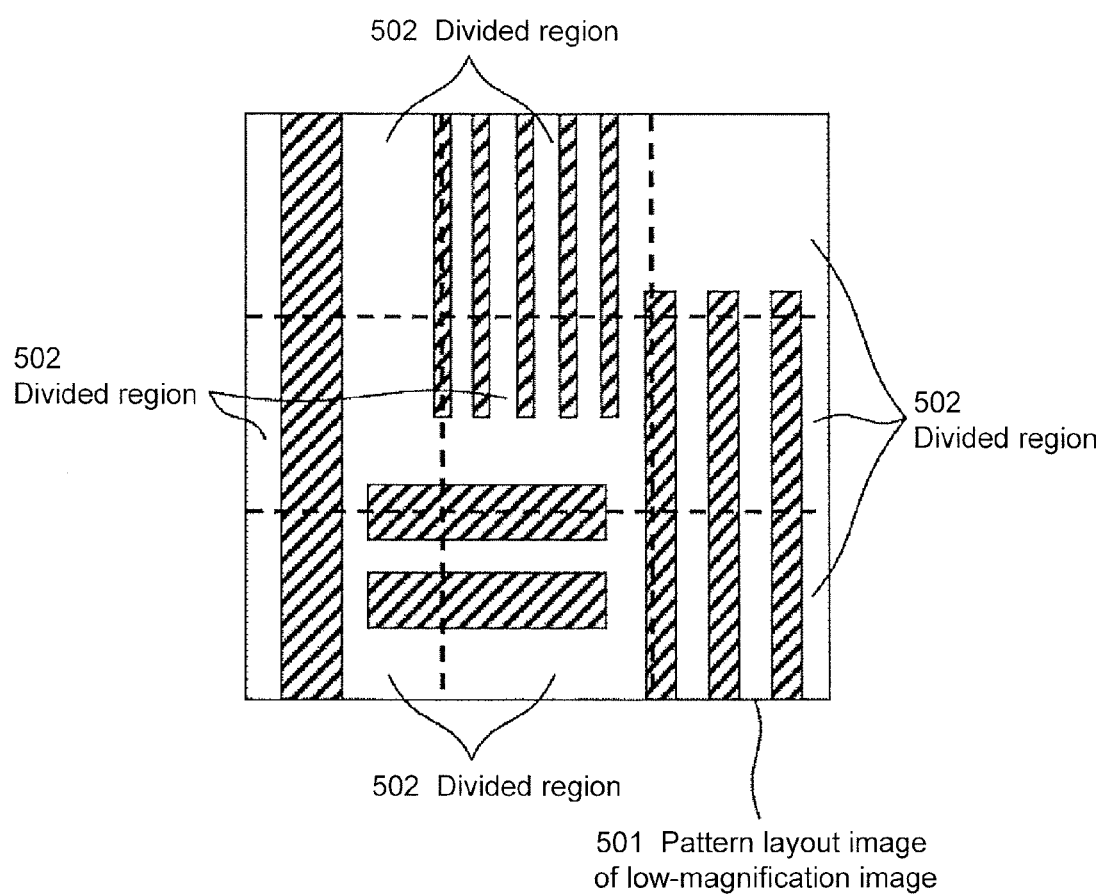
FIG. 9 shows an example of how divided regions of CAD data are set.

Next, specific techniques of an autofocus execution region identifying method are described using FIG. 9. In identifying an autofocus execution region, a pattern layout image corresponding to a low-magnification image is first divided into one or more regions, and a step size correction value is calculated with respect to each divided region. In FIG. 9, there is shown an example where a low-magnification pattern layout image is evenly divided into nine parts. As a method of quantitatively calculating a correction value using CAD data, by way of example, mean brightness values or spatial frequencies of the images of the divided regions are used. Although this is similar to method (3) or (4) mentioned above, no spatial filtering process is performed on the CAD data. The image synthesized from the CAD data is a line image, i.e., a binary image, and is similar to an SEM image to which a spatial filter has been applied. In other words, although SEM images are images with gradations, by performing an edge enhancement process thereon, they may be treated as line images, and since both represent pattern edges as lines, they may be treated similarly.

Correction value $RF_{An}$ determined based on the sparseness/density of a divided region of the pattern layout image may be expressed through Equation [10], where $\delta_A$ is the mean brightness value or spatial frequency of the image. $k_{20}$ and $k_{21}$ in the equation are constants, and n represents the number of the divided region.

$$RF_{An} = k_{20} \times \delta_A + k_2 \qquad \text{Equation [10]}$$

where n=1, 2, 3, . . . .

In other words, correction value $RF_{An}$ would be equal to such a value that an index for sparseness/density (e.g., mean brightness value, spatial frequency, etc.) calculated per divided region is weight-averaged by being multiplied by a predetermined coefficient. It is noted that anything may be used, even a parameter other than the mean brightness value or spatial frequency of the image, so long as it is an index with which the sparseness/density of the pattern may be expressed. By way of example, by using an EDA (Electronic Design Automation) tool or a simulator for detecting risk sites, called hot spots, stemming from the design pattern, it is possible to calculate the arrangement density of the pattern based on CAD data.

Next, with respect to the correction values determined based on the sparseness/density calculated for the respective divided regions, an upper limit or lower limit threshold is defined in advance, and a divided region satisfying that condition is appropriately selected and taken to be an autofocus execution region most suited for executing autofocusing. The reason for defining a threshold is that when the pattern within the autofocus execution region is extremely sparse or dense, there arises a change in the spread of the approximation function for the focal point measure distribution, causing autofocus precision to deteriorate.

As mentioned above, there is shown in FIG. 9 an example where a low-magnification pattern layout image is evenly divided into nine parts. With the pattern layout image in FIG. 9 as a whole denoted by 501, each of the nine divided regions by 502, the respective correction values determined based on sparseness/density by $RF_{An}$ (where n=1, 2, 3, 4, 5, 6, 7, 8, 9), and the pre-defined upper limit and lower limit thresholds by $P_1$ and $P_2$, respectively, the focusing position analysis processing unit 26 sequentially executes a judgment process for judging whether or not the respective correction values calculated for the nine divided regions satisfy Equation [11] below, and a divided region satisfying Equation [11] is set as the autofocus execution region.

$$P_2 < RF_{An} < P_1 \qquad \text{Equation [11]}$$

If there are a plurality of divided regions that satisfy Equation [11], or if there is no divided region with a correction value satisfying Equation [11], a divided region having a correction value determined based on sparseness/density that is closest to the value given by (P1+P2)/2 is taken to be the autofocus execution region.

It is noted that, depending on the material or structure of the pattern on the wafer or on electron optical conditions, how pattern edges appear in an SEM image obtained through actual observation may vary. In such cases, the upper limit and lower limit thresholds $P_1$ and $P_2$ may be made to be parameters that allow user modification. By way of example, a list of thresholds $P_1$ and $P_2$, i.e., a table, corresponding to electron optical conditions or materials and structures of patterns formed on a wafer under observation may be held internally, and a selection and determination may be made automatically from the table as the user sets or enters electron optical conditions or the material or structure of the pattern on the wafer under observation.

It is preferable that the area of each divided region be comparable to or less than the size of the high-magnification autofocus execution region. However, since the size of the low-magnification image may not necessarily be an integer multiple of the size of the high-magnification autofocus execution region, the low-magnification image may in some cases be divided in such a manner that overlapping regions occur between adjacent regions. In addition, during the origin alignment of step 710, some misalignment may occur between the low-magnification image and the layout image. Or, in cases where the high-magnification autofocus execution region is significantly small relative to the low-magnification image region, the correction values for the respective divided regions determined based on sparseness/density may vary, as a result of which the wrong autofocus execution region may be identified in some cases. In view of the above, the pattern layout image may be divided in such a manner that an overlap comparable to an error that might arise during origin alignment occurs between adjacent regions so that even if an error were to occur during origin alignment, the error would be absorbed. It is noted that, if there is only one divided region, that is, if no division is performed, in step 712, the procedure of dividing the pattern layout image into one or more regions is skipped, and just the process of calculating the step size correction value is executed.

Next, in step 713, based on the correction value determined in step 712, step size S' is determined. Step size S' is determined through Equation [12] using the correction value determined in advance based on sparseness/density using Equation [10] representing the relationship between the mean value of the image and the correction value determined based on sparseness/density. S is given by Equation [5].

$$S' = RF_{An} \times S \qquad \text{Equation [12]}$$

where n=1, 2, 3 . . . .

Next, autofocusing is executed with step size S' determined in step 713 (step 107). The excitation intensity of the objective lens 13, which corresponds to the step interval, is varied by the electron optical system control unit 22, and a plurality of images with varying focal positions are obtained and stored on the focusing position analysis processing unit 26. Next, with respect to the stored images, focal point measures, which are indices quantifying the sharpness of a focal point, are calculated at the focusing position analysis processing unit 26, a focal position at which the focal point measure becomes greatest is estimated via a function approximation of the focal point measure distribution, and the excitation intensity of the objective lens 13 is set to the focusing position by the electron optical system control unit 22.

It is noted that the processes of steps 710, 711, 712, and 713 may be performed any point as long as they precede the execution of step 707, and they may be performed before step 702 is executed. Naturally, they may be performed in parallel with steps 702 to 706. In addition, the processes of 710, 711, 712, and 713 need not necessarily be executed at the review SEM itself, and may instead be performed at an external processing device via the network 31, e.g., at an information processing device such as a work station connected to a network.

It is noted that the present method may also be applied to the calculation of an autofocus execution region and step size for low-magnification autofocusing. In the flow in FIG. 8, the process is such that low-magnification autofocusing is not executed at the time of acquisition of the low-magnification reference image or the low-magnification defect image. However, low-magnification autofocusing may be executed during low-magnification image acquisition as needed, such as when defocusing occurs due to the wafer surface being charged, etc. The execution region and step size for low-magnification autofocusing may be determined by substituting a pre-set low-magnification autofocus execution region size in place of the size of the autofocus execution region in step 712.

Finally, a high-magnification defect image is obtained (step 708). Upon completion of step 708, it is determined whether or not there is a coordinate position to be imaged next. If there is one, the view is shifted to the next defect position, and the processes of steps 702 to 708 as well as 710 to 713 are continued. If there are none, imaging is terminated.

A flow representing a procedure of image acquisition during automatic defect observation that uses a method of identifying an autofocus execution region using CAD data, which is layout information for a pattern on a semiconductor wafer, and a method of determining the step size for autofocusing has been described above. By using CAD data, it is possible to automatically determine the optimal execution region and step size conditions for autofocusing a high-magnification defect image without having to obtain a low-magnification image. It is thus particularly effective for automatic risk point observation, called hot spot review, and automatic defect observation in which no low-magnification image is obtained. In addition, since the step size calculation need only be parallel processed prior to observation or by the time high-magnification autofocusing is executed during observation, it also provides an effect of mitigating device load.

As discussed above, in an embodiment of the present example, the configuration was made to be such that the execution region and step size for autofocusing are determined using the sparseness/density of a layout image corresponding to a low-magnification image based on CAD data, and, further, the setting of a step width was made unnecessary. It is noted that, for the examples discussed above, descriptions have been provided with respect to, as embodiments with which the greatest effects may be obtained, review SEM devices as applications of the electron microscope. However, similar effects may also be obtained with charged particle beam devices having an autofocusing function, e.g., CD-SEMs, etc.

REFERENCE SIGNS LIST

8 Imaging device
9 Electron source
10, 11 Condenser lens
12 Deflection scanning coil
13 Objective lens
15 XY stage
16 Storage device
17 Display
18 Input device
19 Overall control unit
20 Image processing unit
21 A/D conversion unit
22 Electron optical system control unit
23 Stage control unit
24 High-voltage stabilized power source
25 Detector
26 Focusing position analysis processing unit
27 Astigmatism correction coil
31 Network
32 Inspection device
33 CAD database server

The invention claimed is:

1. A charged particle beam device having autofocusing means that obtains a plurality of images with varying focal positions by shifting a focal position in increments of a predetermined step size and estimates a focusing position based on the plurality of images, the charged particle beam device comprising:
   imaging means that obtains images at a first magnification and a second magnification greater than the first magnification;
   focusing position analysis processing means that obtains an image feature based on a region selected from the image of the first magnification;
   step size determination means that obtains a step size based on the image feature obtained by the focusing position analysis processing means; and
   autofocus execution means that executes autofocusing at the second magnification using the step size obtained by the step size determination means.

2. The charged particle beam device according to claim 1, wherein the image feature comprises a sparseness/density or pattern edge amount of a pattern with respect to the selected region.

3. The charged particle beam device according to claim 1, further comprising step size judging means that judges whether or not the step size that has been set or the image feature satisfies a pre-defined standard.

4. The charged particle beam device according to claim 3, wherein the step size judging means displays a judgment result.

5. The charged particle beam device according to claim 1, wherein
   the focusing position analysis processing means executes a plurality of methods of calculating the image feature, and
   the step size determination means sets the step size used by the autofocus execution means by combining a plurality of step sizes obtained based on the respective image features calculated using the plurality of methods.

6. The charged particle beam device according to claim 5, wherein the respective image features obtained by the plurality of methods are configurable with respect to their contributions to the step size used by the autofocus execution means.

7. The charged particle beam device according to claim 1, further comprising an autofocus parameter setting screen, wherein
   a mode in which the step size is automatically set using the image feature is selectable.

8. The charged particle beam device according to claim 1, wherein the image of the first magnification comprises a pattern layout image of CAD data corresponding to an image obtained at the first magnification.

9. The charged particle beam device according to claim 8, wherein
   the focusing position analysis processing means:
      divides the pattern layout image into a plurality of regions;
      calculates the image feature for each of the divided plurality of regions; and
      selects from the plurality of regions a region having an image feature satisfying a pre-defined standard, and
   the step size determination means calculates the step size based on an image feature calculated based on the selected region.

10. The charged particle beam device according to claim 9, wherein the focusing position analysis processing means divides the CAD data into a plurality of regions comprising overlapping parts among adjacent regions.

11. An information processing device connected with a charged particle beam device having autofocusing means that obtains a plurality of images with varying focal positions by shifting a focal position in increments of a predetermined step size and estimates a focusing position based on the plurality of images, the information processing device comprising:

focusing position analysis processing means that obtains an image feature of a region selected from CAD data corresponding to a low-magnification image obtained from the charged particle beam device;

step size determination means that obtains a step size based on the image feature obtained by the focusing position analysis processing means; and step size sending means that sends the step size obtained by the step size determination means to the charged particle beam device.

12. An observation method using a charged particle beam, the observation method comprising:

obtaining an image at a first magnification;

obtaining an image feature based on a region selected from the image of the first magnification;

obtaining a step size based on the image feature, the step size being an amount of change in focal position for when obtaining a plurality of images with varying focal positions; and executing autofocusing by obtaining, at a second magnification greater than the first magnification, a plurality of images by shifting a focal position in increments of the step size.

13. The observation method using a charged particle beam according to claim 12, wherein the image feature comprises a sparseness/density or pattern edge amount of a pattern with respect to the region selected from the image obtained at the first magnification.

14. The observation method using a charged particle beam according to claim 12, further comprising judging whether or not the step size that has been set or the image feature satisfies a pre-defined standard.

15. The observation method using a charged particle beam according to claim 14, further comprising displaying a judgment result.

16. The observation method using a charged particle beam according to claim 14, further comprising calculating the image feature using a plurality of methods, wherein the step size used for autofocusing is configurable by combining a plurality of step sizes obtained based on the respective image features calculated using the plurality of methods.

17. The observation method using a charged particle beam according to claim 14, wherein the image of the first magnification comprises a pattern layout image of CAD data corresponding to an image obtained at the first magnification.

18. An autofocusing method in which a plurality of images with varying focal positions are obtained by shifting a focal position in increments of a predetermined step size and in which a focusing position is estimated based on the plurality of images, the autofocusing method comprising:

obtaining an image at a first magnification;

obtaining an image feature based on the image obtained at the first magnification;

based on the image feature, obtaining a pre-defined step size for obtaining a plurality of images with varying focal positions; and executing autofocusing by obtaining, at a second magnification greater than the first magnification, a plurality of images by shifting a focal position using the step size.

\* \* \* \* \*